(12) United States Patent
Bhat et al.

(10) Patent No.: US 10,261,153 B2
(45) Date of Patent: Apr. 16, 2019

(54) MAGNETIC RESONANCE APPARATUS AND METHOD FOR SIMULTANEOUS MULTI-CONTRAST ACQUISITION WITH SIMULTANEOUS MULTISLICE IMAGING

(71) Applicant: Siemens Healthcare GmbH, Erlangen (DE)

(72) Inventors: Himanshu Bhat, Newton, MA (US); Pedro Miguel Itriago Leon, Caracas (VE); Dominik Paul, Bubenreuth (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 217 days.

(21) Appl. No.: 15/262,799

(22) Filed: Sep. 12, 2016

(65) Prior Publication Data
US 2017/0108567 A1   Apr. 20, 2017

Related U.S. Application Data

(60) Provisional application No. 62/241,849, filed on Oct. 15, 2015.

(51) Int. Cl.
*G01V 3/00* (2006.01)
*G01R 33/56* (2006.01)
(Continued)

(52) U.S. Cl.
CPC ..... *G01R 33/5602* (2013.01); *G01R 33/4835* (2013.01); *G01R 33/50* (2013.01); *G01R 33/5611* (2013.01); *G01R 33/5617* (2013.01)

(58) Field of Classification Search
CPC .. G01R 33/34; G01R 33/34007; G01R 33/36; G01R 33/3635; G01R 33/3642;
(Continued)

(56) References Cited

U.S. PATENT DOCUMENTS

| | | | |
|---|---|---|---|
| 7,034,532 B1 * | 4/2006 | Shenoy | G01R 33/5613 |
| | | | 324/307 |
| 8,498,688 B2 * | 7/2013 | Lamerichs | G01R 33/485 |
| | | | 600/407 |

(Continued)

OTHER PUBLICATIONS

Feinberg et al. "Simultaneous Echo Refocusing in EPI," Magnetic Resonance in Medicine, vol. 48, pp. 1-5 (2002).
(Continued)

*Primary Examiner* — Thang X Le
(74) *Attorney, Agent, or Firm* — Schiff Hardin LLP

(57) ABSTRACT

A magnetic resonance (MR) method and apparatus use simultaneous multislice imaging, with different excitations being effective for different slices in respective iterations of a single scanning sequence, in order to acquire raw MR data from different multiple slices, with respectively different contrasts, in the single scanning sequence. Single band excitation of a first slice among the multiple slices takes place in a first iteration of the single scanning sequence, with multi-band excitation then occurring for all of the multiple slices. Raw data are then acquired from the first slice, and at least one other slice among the multiple slices, that respectively exhibit different contrasts due to only the first slice being affected by the single band excitation. In a second iteration of the single scanning sequence, another slice is excited with single band excitation, and the first slice is among the multiple slices excited with multi-band excitation. Raw data are then acquired from the first slice and at least one other slice among the multiple slices that have the respective contrasts swapped in comparison to the first iteration.

18 Claims, 7 Drawing Sheets

(51) Int. Cl.
*G01R 33/483* (2006.01)
*G01R 33/50* (2006.01)
*G01R 33/561* (2006.01)

(58) Field of Classification Search
CPC .. G01R 33/48; G01R 33/4818; G01R 33/481; G01R 33/4824; G01R 33/446; G01R 33/4835; G01R 33/4828; G01R 33/54; G01R 33/543; G01R 33/561; G01R 33/563; G01R 33/565; G01R 33/5612; G01R 33/583; G01R 33/5659; G01R 33/56518; G01R 33/56536; G01R 33/56572; G01R 33/5611; G01R 33/5614; G01R 33/5616; G01R 33/56509; G01R 33/341; G01R 33/385; G01R 33/5635; G01R 33/56358; A61B 5/055; A61B 5/0555; A61B 5/7278; A61B 5/725
See application file for complete search history.

(56) References Cited

U.S. PATENT DOCUMENTS

| | | | |
|---|---|---|---|
| 2014/0210471 A1* | 7/2014 | Stemmer | G01R 33/56554 324/309 |
| 2015/0260820 A1 | 9/2015 | Speier | |
| 2016/0033603 A1* | 2/2016 | Paul | G01R 33/4818 324/309 |
| 2017/0030986 A1* | 2/2017 | James | G01R 33/4818 |
| 2018/0136297 A1* | 5/2018 | Koch | G01V 3/14 |

OTHER PUBLICATIONS

Cauley et al., "Interstice Leakage Artifact Reduction Technique for Simultaneous Multislice Acquisitions," Magnetic Resonance in Medicine, vol. 72, pp. 93-102 (2014).

Setsompop et al., "Improving Diffusion MRI Using Simultaneous Multi-Slice Echo Planar Imaging," NeuroImage, vol. 63, pp. 569-580 (2012).

Setsompop et al., "Blipped-Controlled Aliasing in Parallel Imaging for Simultaneous Multislice Echo Planar Imaging With Reduced g-Factor Penalty," Magnetic Resonance in Medicine, vol. 67, pp. 1210-1224 (2012).

Wright et al. "Water Proton $T_1$ Measurements in Brain Tissue at 7, 3, and 1.5T Using IR-EPI, IR-TSE and MPRAG: Results and Optimization," Magn. Reson. Mater. Phy. vol. 21, pp. 121-130 (2008).

\* cited by examiner

MAGNETIC RESONANCE APPARATUS AND METHOD FOR SIMULTANEOUS MULTI-CONTRAST ACQUISITION WITH SIMULTANEOUS MULTISLICE IMAGING

RELATED APPLICATION

The present application claims the benefit of the filing date of provisional application 62/241,849, filed on Oct. 15, 2015, the contents of which are incorporated herein by reference.

BACKGROUND OF THE INVENTION

Field of the Invention

The present invention concerns methods and devices for magnetic resonance imaging, and in particular to such methods and devices that acquire magnetic resonance raw data from multiple slices simultaneously, a technique known as simultaneous multislice (SMS) imaging.

Description of the Prior Art

MR imaging is a widely used imaging modality for medical diagnosis as well as for material inspection.

In a magnetic resonance apparatus, the examination object (a patient, in the case of medical magnetic resonance imaging) is exposed to a strong and constant basic magnetic field, by the operation of a basic field magnet of an MR scanner, in which the examination object is situated. The MR scanner also has a gradient coil arrangement that is operated in order to activate gradient fields that spatially encode the magnetic resonance signals. The magnetic resonance signals are produced by the radiation of radio-frequency (RF) pulses from an RF radiator, such as one or more antennas, in the MR scanner. These RF pulses excite nuclear spins in the examination object, and are therefore often called excitation pulses. The excitation of the nuclear spins at an appropriate frequency gives the excited spins a magnetization that causes the nuclear spins to deviate, by an amount called the flip angle, from the alignment of the nuclear spins that was produced by the basic magnetic field. As the nuclear spins relax, while returning to alignment in the basic magnetic field, they emit MR signals (which are also RF signals), which are received by suitable RF reception antennas in the MR scanner, which may be the same or different from the RF radiator used to emit the excitation pulse.

The emitted MR signals have a signal intensity that is dependent on the exponential decay over time of the magnetization of the nuclear spins. The acquired signals are digitized so as to final raw data, which are entered into a memory that is organized as k-space, as k-space data. Many techniques are known for reconstructing an image of the examination object from the k-space data.

By appropriately selecting different characteristics of the MR data acquisition sequence that is used, the acquired signals can be differently weighted so that different sources of the detected MR signals (i.e., different tissues in the case of medical MR imaging) appear with different contrasts in the reconstructed image. In the case of medical MR imaging, a weighting is selected that causes the tissue that is important for making the intended medical diagnosis to have the best contrast (brightness) in the reconstructed image. One such type of weighting is known as T1-weighting, because it depends on the so-called T1 relaxation time of the nuclear spins.

Many different techniques are known for acquiring the raw MR data. One such technique is known as simultaneous multi-slice (SMS) acquisition, which is a technique for accelerating the acquisition of the data from a given volume of the examination object, wherein nuclear spins in multiple slices are excited simultaneously, and the resulting MR signals are simultaneously acquired from each slice. This results in a dataset in k-space that is composed of data from the multiple slices collapsed on top of each other. Techniques are known for separating or uncollapsing the data for these respective slices during image reconstruction, such as the slice GRAPPA (Generalized Autocalibration Partially Parallel Acquisitions) technique, which is schematically illustrated in FIG. 1. In the example shown in FIG. 1, multiple slices S1, S2 and S3 are excited simultaneously, resulting in each slice generating an echo train of magnetic resonance signals, which are acquired according to the known blipped CAIPIRINHA (Controlled Aliasing in Parallel Imaging Results in Higher Acceleration) technique. Details of such techniques are described, for example, in Setsompop et al., "Blipped-Controlled Aliasing in Parallel Imaging for Simultaneous Multislice Echo Planar Imaging With Reduced g-Factor Penalty," Magnetic Resonance in Medicine, Vol. 67, pp. 1210-1224 (2012) and Setsompop et al., "Improving Diffusion MRI Using Simultaneous Multi-Slice Echo Planar Imaging," NeuroImage, Vol. 63, pp. 569-580 (2012) and Cauley et al., "Interslice Leakage Artifact Reduction Technique for Simultaneous Multislice Acquisitions," Magnetic Resonance in Medicine, Vol. 72, pp. 93-102 (2014).

Excitation of the nuclear spins in the simultaneously acquired slices is implemented with a multi-band (MB) RF pulse. An MB RF pulse is generated by the superimposition of a number of individual single band (SB) RF pulses, of the type that are typically used to excite nuclear spins in a single selected slice in conventional magnetic resonance imaging.

The turbo spin echo (TSE) sequence is the "clinical workhorse" sequence for MR imaging, by virtue of being the most utilized sequence for all types of body region imaging. A TSE sequence has several echo trains, and in each echo train, multiple phase encoding lines of the entirety of k-space are scanned (filled with data) after one excitation pulse. This is achieved by refocusing the spins after each readout line, utilizing refocusing RF pulses. Compared to a conventional spin echo (SE) sequence, the acquisition time in a TSE sequence is reduced by the number of refocused echoes in one echo train. This reduction is known as the turbo factor.

A conventional TSE sequence is illustrated in FIG. 2, with the example of sixteen echoes.

It is known to combine SMS and TSE, in order to acquire data from two or more slices simultaneously. This reduces the minimum repetition time (TR) which is given by the length of all echo trains for all slices that are executed back-to-back. The reduction occurs because fewer slices must be acquired with such a combination. The total number of reduced slices is known as the slice acceleration factor. For many examinations, however, the minimum TR is not limited by the total time of all echo trains, but instead is limited by the desired image contrast.

For example, for T2-weighted imaging, a long TR is necessary to allow for T1 relaxation to provide the desired T2 contrast. This means that if the TR is five seconds without SMS, an SMS factor of 2 would allow a TR reduction to 2.5 seconds, but this reduction cannot be achieved without changing the image contrast to a level that is not clinically acceptable.

The echo trains for two adjacent slices in TSE imaging are often produced in two concatenations, such as to prevent slice-crosstalk effects. With SMS it would be theoretically possible to reduce the number of concatenations, but in practice this would again lead to slice-crosstalk.

In order to provide adequate diagnostics, it is often necessary to acquire the identical slice stack of a subject with two different TSE contrasts. One example is a T2-weighted TSE and a T2-weighted TSE with CSF attenuation for the brain (known as a FLAIR sequence). Another example is a T1, proton density (PD) or T2-weighted TSE with and without fat saturation (fs) for joint imaging, known as T1/T1 fs, PD/PD fs or T2/T2 fs.

The fluid attenuated in version recovery (FLAIR) T2-weighted TSE sequence basically has a T2-weighted contrast and, in the case of brain imaging, the cerebrospinal fluid (CSF) is suppressed by preceding inversion pulses, and a relatively long weighting time (approximately 2.5 s) between the IR pulses and the readout module. A conventional T2-weighted TSE sequence with TR=5 s is shown in FIG. 3, and a conventional FLAIR T2-weighted TSE sequence with TR=8 is shown in FIG. 4. The echo train section at the right of the sequence in FIG. 4 is identical to the section shown in FIG. 2 (despite the longer inter-slice echo train gap, which is not necessary but results from the available fill time). However, inversion pulses with a waiting time have to be applied to obtain the fluid attenuated contrast.

The echo trains for two adjacent slices are often produced in two concatenations in order to prevent slice crosstalk effects. With SMS, it would be theoretically possible to reduce the number of concatenations, but in practice this would again lead to slice crosstalk. Another drawback is that the IR pulse might not be realized with SMS due to peak power limitation (two single-slice pulses summed to one multi-band pulse lead to twice the peak power).

A typical MR examination may include multiple TSE sequences with different contrasts. For example, a typical head scan includes the aforementioned T2-weighted TSE and a FLAIR T2-weighted TSE.

Another MR imaging technique for acquiring a dataset containing image data from multiple slices that allows the image dataset to have different contrasts, is described in United States Patent Application Publication No. 2015/0260820. In the procedure described therein, an MB RF pulse is radiated in a first step in order to excite nuclear spins in at least two slices of a subject. The slices are phase encoded in a second step by applying a phase encoding gradient. The scan signals of the excited slices are spread out in a third step, using each coil of a multi-coil array. The phase of the scan signal in one of the first or second steps, in at least one slice, is modulated at least once in order to cause the phase of scan signal thereof to be different from the phase of the other slices. Image datasets are reconstructed dependent on the modulation of the phase of the scan signal in at least one slice. The MB RF pulse has, in at least one sequence of the first, second and third steps in at least one slice, a different amplitude and/or duration and/or pulse shape and/or deflection angle from the other slice or slices, with the deflection angle difference being other than 180°. By varying at least one of the amplitude, duration or pulse shape in the slices, in addition to the phase shift, the image datasets have different contrasts in the images of the different slices that are reconstructed.

SUMMARY OF THE INVENTION

An object of the present invention is to provide an MR imaging apparatus and method wherein the SMS technique is utilized to acquire raw data for multiple slices with the respective slices having a different individual contrast, within one scanning sequence.

This object is achieved in accordance with the present invention by an MR imaging method and apparatus wherein the MR data acquisition scanner is operated with a single scanning sequence in at least two iterations. In a first of the iterations, single band excitation of nuclear spins in only one slice, among multiple slices that are to be simultaneously acquired, followed by multi-band excitation of more than one slice among the multiple slices. The resulting echo trains are read out and have respectively different weightings for the differently-excited slices, due to the single band excitation being effective for only the aforementioned first slice. In a second iteration of the single scanning sequence, the reverse takes place, and the single band excitation in the second iteration is effective only for a second (different) slice among the multiple slices, and the multi-band excitation is effective for that second slice, as well as the aforementioned first slice. The resulting echo train is then read out with the opposite weightings for the first and second slices. A k-space dataset is thereby acquired, in a single scanning sequence that includes respective k-space data subsets for the first slice with each of the two different weightings, and respective k-space data subsets for the second slice also with each of the two different weightings.

An important advantage of the method and apparatus in accordance with the invention is that a significant time reduction for the MR raw data acquisition can be achieved, because several sequences, which have conventionally been executed consecutively during an examination, are combined into a single scanning sequence. The time saving in accordance with the present invention in most cases will exceed the time saving of using SMS in a single contrast sequence, with only limited TR reduction capabilities.

A further advantage of the method and apparatus in accordance with the invention is that the slice profiles of preparation pulses that are conventionally used in the aforementioned sequence combinations typically must be very precise, and such precision can be achieved better using single band pulses as in the inventive method and apparatus.

DESCRIPTION OF THE PREFERRED EMBODIMENTS

Figure 1:
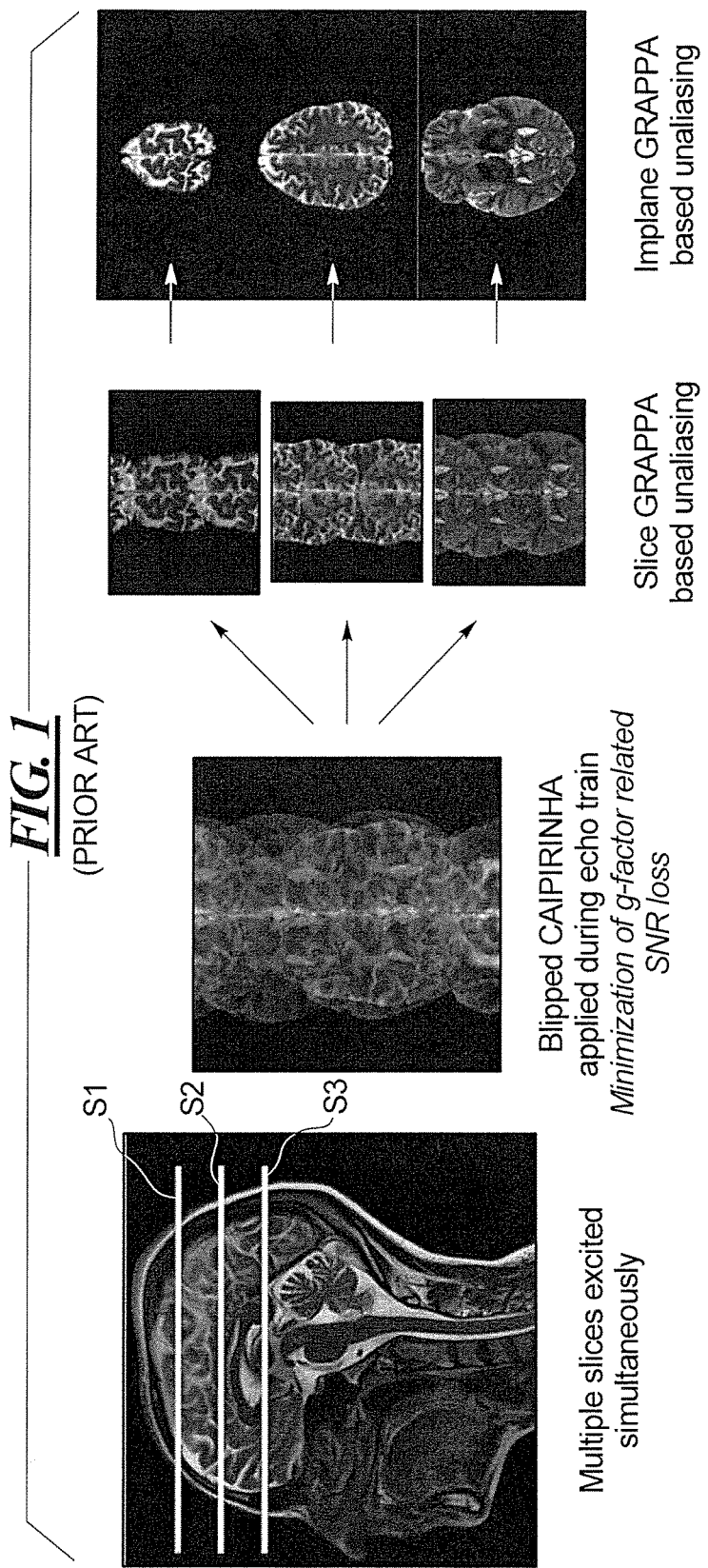
FIG. 1, as noted above, schematically illustrates a conventional SMS acceleration technique.
Figure 2:
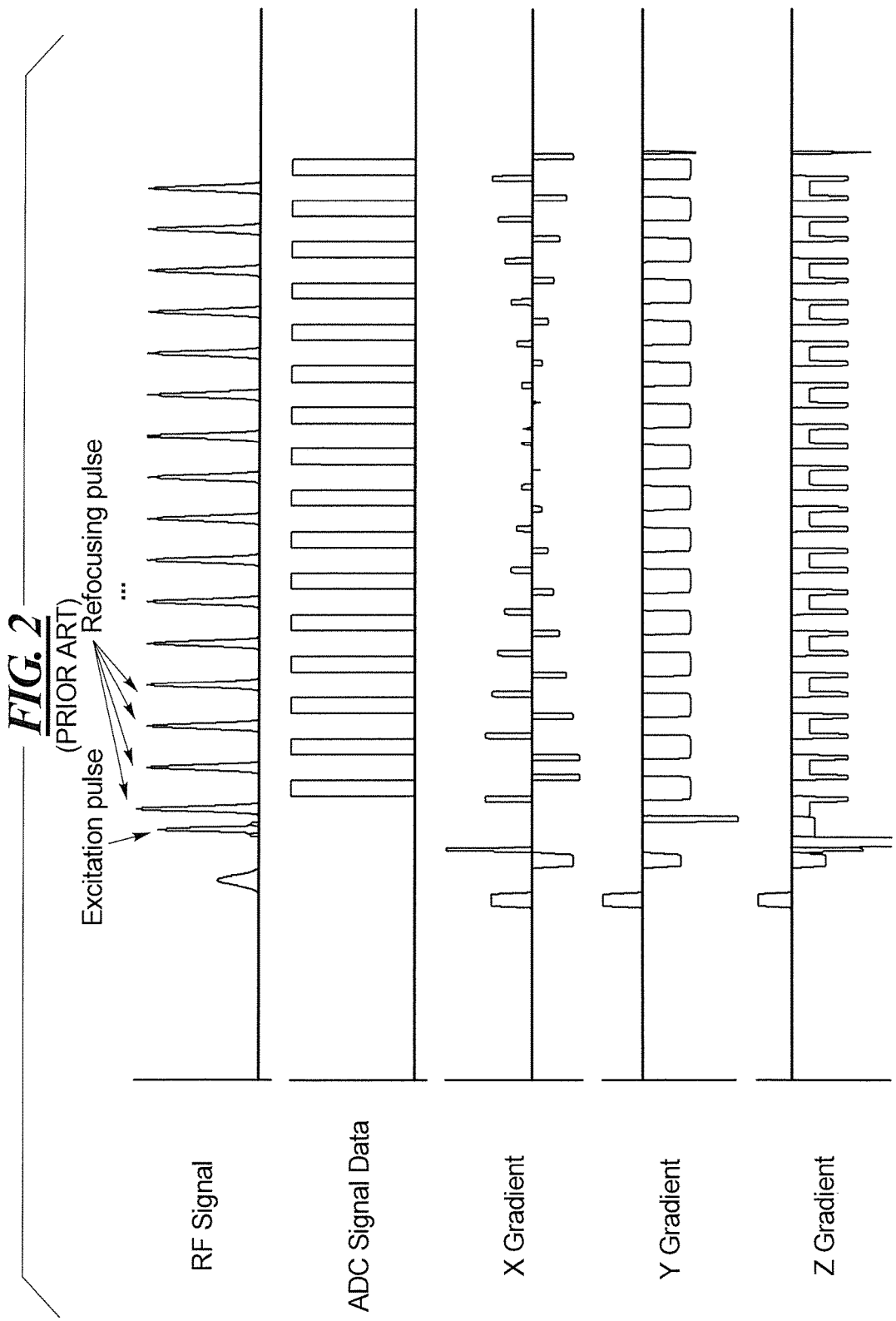
FIG. 2, as noted above, schematically illustrates a conventional TSE sequence, with the example of sixteen echoes.
Figure 3:
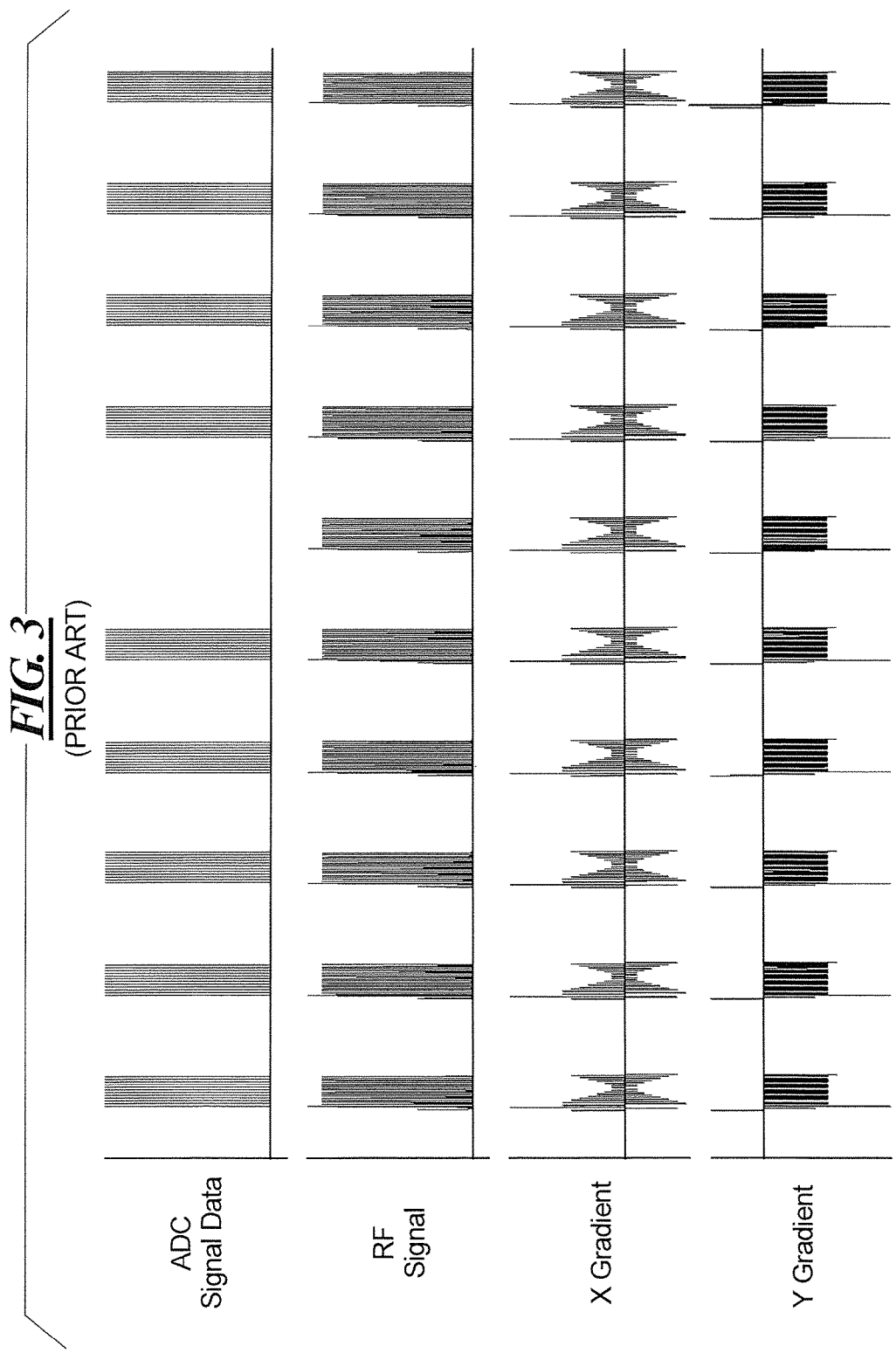
FIG. 3, as noted above, schematically illustrates a conventional T2-weighted TSE sequence, with the example of an echo train for ten slices.
Figure 4:
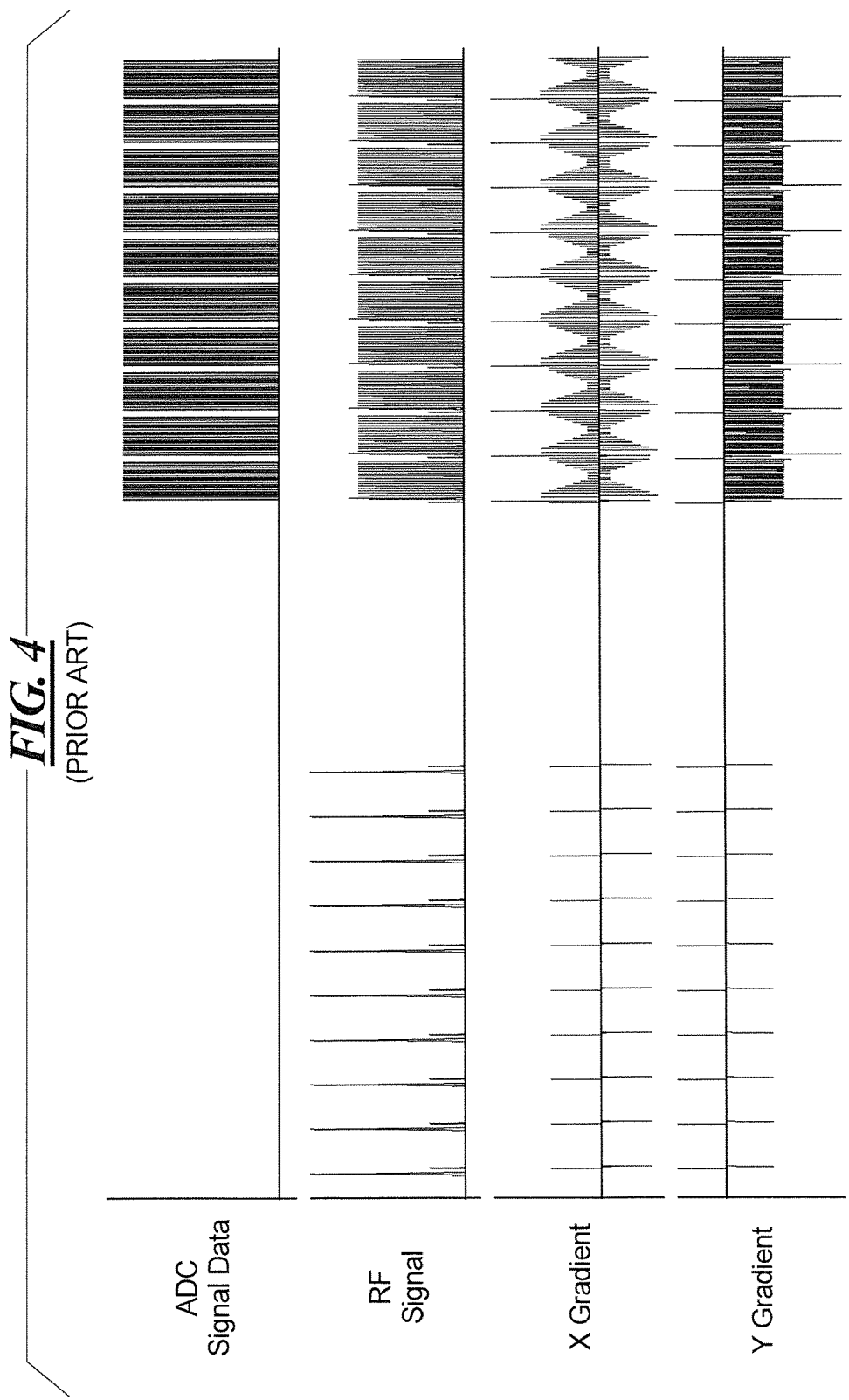
FIG. 4, as noted above, schematically illustrates a conventional FLAIR T2-weighted TSE sequence, showing an echo train for ten slices as an example.
Figure 5:
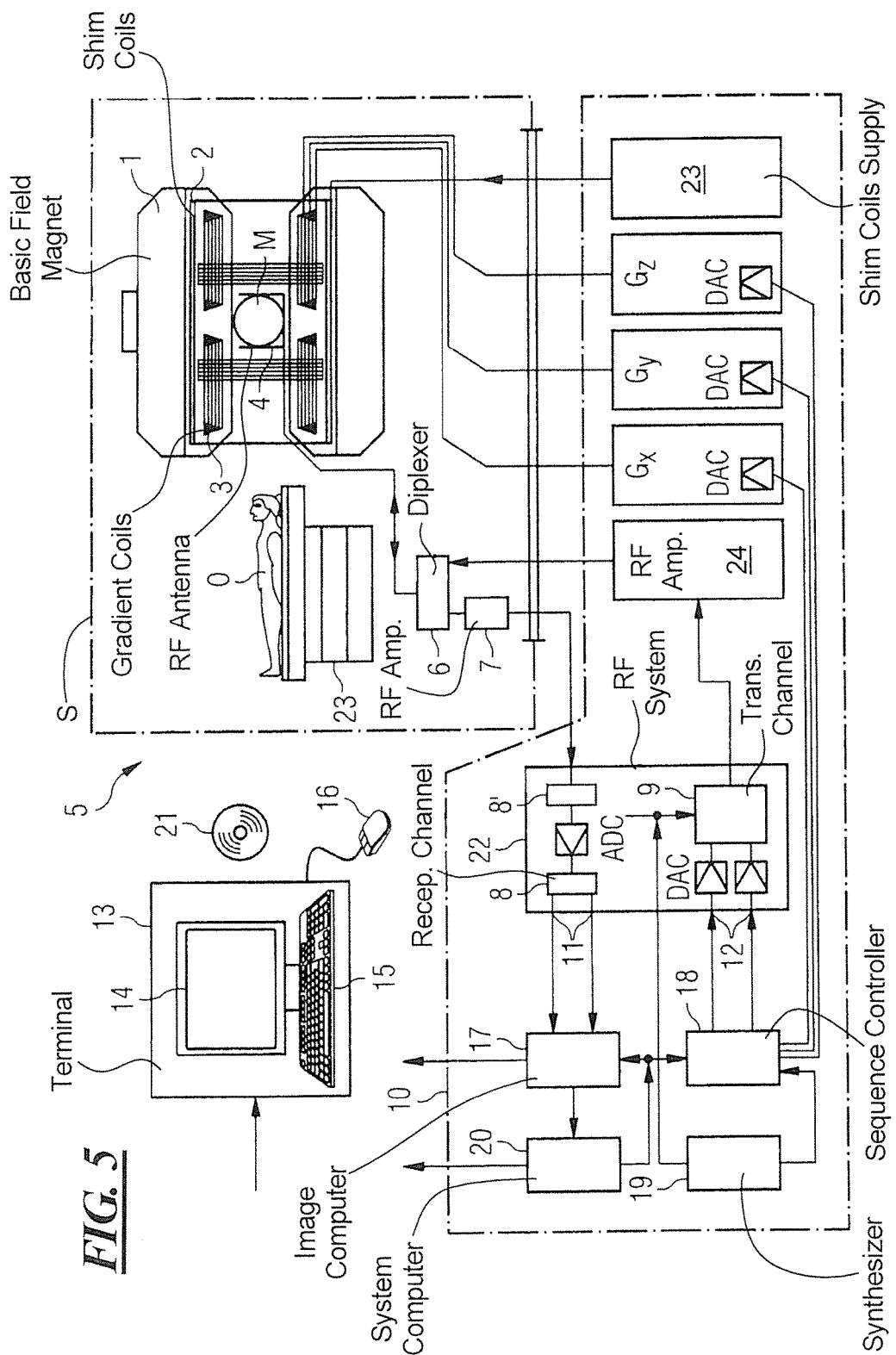
FIG. 5 is a block diagram of a magnetic resonance apparatus constructed and operating in accordance with the present invention.

FIG. 5 schematically illustrates a magnetic resonance apparatus 5 (a magnetic resonance imaging or tomography device). A basic field magnet 1 generates, a temporally constant strong magnetic field for the polarization or alignment of the nuclear spin in a region of an examination subject O, such as a portion of a human body that is to be examined, lying on a table 23 in order to be moved into the magnetic resonance apparatus 5. The high degree of homogeneity in the basic magnetic field necessary for the magnetic resonance measurement (data acquisition) is defined in a typically sphere-shaped measurement volume M, in which the portion of the human body that is to be examined is placed. In order to support the homogeneity requirements temporally constant effects are eliminated by shim-plates made of ferromagnetic materials are placed at appropriate positions. Temporally variable effects are eliminated by shim-coils 2 and an appropriate control unit 23 for the shim-coils 2.

A cylindrically shaped gradient coil system 3 is incorporated in the basic field magnet 1, composed of three windings. Each winding is supplied by a corresponding amplifier Gx, Gy and Gz, with power for generating a linear gradient field in a respective axis of a Cartesian coordinate system. The first partial winding of the gradient field system 3 generates a gradient Gx in the x-axis, the second partial winding generates a gradient Gy in the y-axis, and the third partial winding generates a gradient Gz in the z-axis. Each amplifier 24-26 has a digital-analog converter (DAC), controlled by a sequencer 18 for the accurately-times generation of gradient pulses.

A radio-frequency antenna 4 is located within the gradient field system 3, which converts the radio-frequency pulses provided by a radio-frequency power amplifier 24 into a magnetic alternating field for the excitation of the nuclei by tipping ("flipping") the spins in the subject or the region thereof to be examined, from the alignment produced by the basic magnetic field. The radio-frequency antenna 4 is composed of one or more RF transmitting coils and one or more RF receiving coils in the form of an annular, linear or matrix type configuration of coils. The alternating field based on the precessing nuclear spin, i.e. the nuclear spin echo signal normally produced from a pulse sequence composed of one or more radio-frequency pulses and one or more gradient pulses, is also converted by the RF receiving coils of the radio-frequency antenna 4 into a voltage (measurement signal), which is transmitted to a radio-frequency system 22 via an amplifier 7 of a radio-frequency receiver channel 8, 8'. The radio-frequency system 22 furthermore has a transmitting channel 9, in which the radio-frequency pulses for the excitation of the magnetic nuclear resonance are generated. For this purpose, the respective radio-frequency pulses are digitally depicted in the sequencer 18 as a series of complex numbers, based on a given pulse sequence provided by the system computer 20. This number series is sent via an input 12, in each case, as real and imaginary number components to a digital-analog converter (DAC) in the radio-frequency system 22 and from there to the transmitting channel 9. The pulse sequences are modulated in the transmitting channel 9 to a radio-frequency carrier signal, the base frequency of which corresponds to the resonance frequency of the nuclear spin in the measurement volume. The modulated pulse sequences of the RF transmitter coil are transmitted to the radio-frequency antenna 4 via an amplifier 28.

Switching from transmitting to receiving operation occurs via a transmission-receiving switch 6. The RF transmitting coil of the radio-frequency antenna 4 radiates the radio-frequency pulse for the excitation of the nuclear spin in the measurement volume M and scans the resulting echo signals via the RF receiving coils. The corresponding magnetic resonance signals obtained thereby are demodulated to an intermediate frequency in a phase sensitive manner in a first demodulator 8' of the receiving channel of the radio-frequency system 22, and digitalized in an analog-digital converter (ADC). This signal is then demodulated to the base frequency. The demodulation to the base frequency and the separation into real and imaginary parts occurs after digitization in the spatial domain in a second demodulator 8, which emits the demodulated data via outputs 11 to an image processor 17. In an image processor 17, an MR image is reconstructed from the measurement data obtained in this manner through the use of the method according to the invention, which includes computation of at least one disturbance matrix and the inversion thereof, in the image processor 17. The management of the measurement data, the image data, and the control program occurs via the system computer 20. The sequencer 18 controls the generation of the desired pulse sequences and the corresponding scanning of k-space with control programs, in particular, in accordance with the method according to the invention. The sequencer 18 controls accurately-timed switching (activation) of the gradients, the transmission of the radio-frequency pulse with a defined phase amplitude, and the reception of the magnetic resonance signals. The time base for the radio-frequency system 22 and the sequencer 18 is provided by a synthesizer 19. The selection of appropriate control programs for the generation of an MR image, which are stored, for example, on a DVD 21, as well as other user inputs such as a desired number n of adjacent clusters, which are to collectively cover the desired k-space, and the display of the generated MR images, occurs via a terminal 13, which includes units for enabling input entries, such as, e.g. a keyboard 15, and/or a mouse 16, and a unit for enabling a display, such as, e.g. a display screen.

The components within the dot-dash outline S are commonly called a magnetic resonance scanner.

Figure 6:
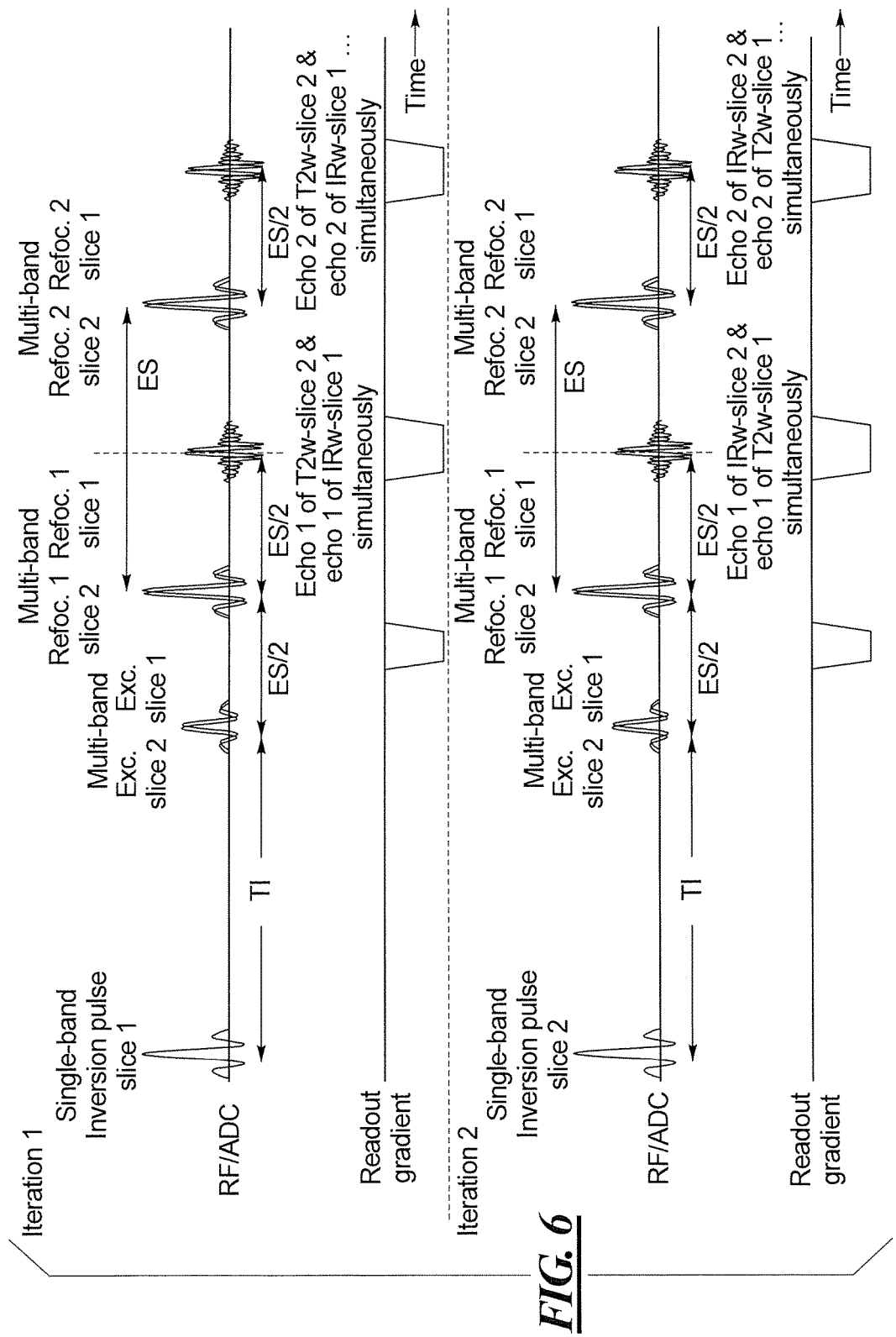
FIG. 6 schematically illustrates an accelerated multi-contrast MR data acquisition sequence in accordance with the invention, in the example of a TSE sequence with T2-weighting and FLAIR-T2 weighting.

An example of simultaneous acquisition of raw MR data with T2 weighting and FLAIR-T2 weighting, respectively for different slices, is shown in FIG. 6, using the example of a TSE multi-band sequence. For clarity, only two refocusing pulses and two echoes of the echo train are shown. Also, the slice 1 and slice 2 contributions to the multi-band pulse, and the ADC waveforms, are slightly shifted for clarity. Slices 1 and 2 with a spacing therebetween are acquired simultaneously from an examination subject situated in the scanner.

The sequence example shown in FIG. 6 uses the timing of a conventional FLAIR-T2 sequence. First, a single band inversion pulse is radiated that is effective only for slice 1. After the inversion time TI, the conventional T2-weighted echo train is started. In contrast to the aforementioned inversion pulse, the excitation and refocusing pulses in this echo train are multi-banded, in order to excite and refocus both slices 1 and 2 simultaneously. Therefore, echoes for slices 1 and 2 are acquired by the ADC (analog-to-digital converter) events simultaneously. The contrasts for slices 1 and 2 readouts will be respectively different. Data are entered into lines of k-space for slice 1 that exhibit a FLAIR-T2 weighting, whereas data entered into lines of k-space for slice 2 exhibit a pure T2-weighting, because the magnetization of slice 2 was not affected by the single band inversion pulse radiated for slice 1.

In a second iteration of the single sequence, the single band IR pulse excites only slice 2. In this second iteration, the raw data from slice 1 exhibit pure T2-weighting, whereas the raw data acquired from slice 2 exhibit FLAIR-T2 weighting.

Figure 7:
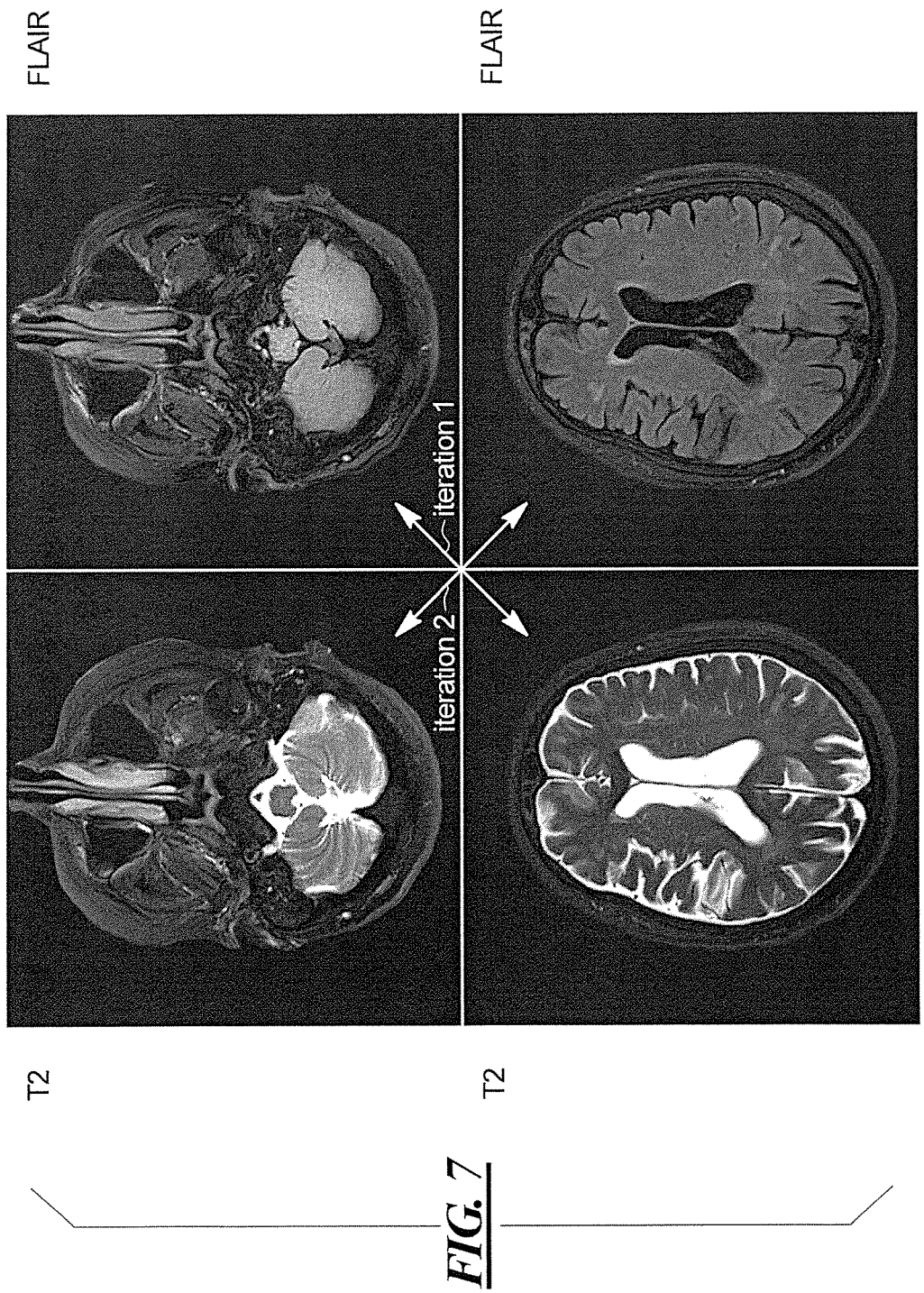
FIG. 7 shows T2 contrast images and T2 FLAIR contrast images for two different slices reconstructed from raw data acquired with the exemplary pulse sequence shown in FIG. 6.

As a consequence, a complete T2-weighted scan for both slices 1 and 2 can be acquired in addition to the complete FLAIR-T2 weighted scan for both slices 1 and 2 without increasing the scan time needed for the FLAIR-T2 weighted scan only. Images obtained using the sequence of FIG. 6 are shown in FIG. 7.

For SMS factors larger than two, different schemes are possible. For example, in the case of simultaneous acquisition of raw MR data from three slices, the IR pulse could be effective for (target) slice 1, but not slices 2 and 3 in the first iteration, and would be effective for slices 2 and 3 simultaneously, but not for slice 1, in the second iteration.

The sequence in accordance with the invention is not limited to the T2/FLAIR-T2 combination shown in the example of FIG. 6 in detail. Any combination of slice-selective/spatiospectral selective pulses can be used.

Apart from the T2/FLAIR-T2 example, a simultaneous acquisition of PD (proton density) weighting and T1-FLAIR weighting is possible, which may be useful for spine and neuro applications. A further example is to use STIR (Short T1 Inversion-Recovery) sequence, or a spatiospectral fat sat (fat saturation) pulse, instead of the FLAIR pulse sequence. This could be combined with T1, T2 or PD contrast acquisition, and allows one image stack to be obtained with fat saturation and another image stack to be obtained at the same time without fat saturation. This may be useful, for example, for joint examinations, as well neuro and spine examinations. The application is in principle the same as described above in detail in connection with FIG. 6. A single band spatiospectral fat sat or STIR preparation pulse is applied, and a multi-band readout then takes place for at least two slices. One slice exhibits fat saturation, the other has unmodified contrast. The aforementioned takes place in a first iteration and in a second iteration, the slice that is affected by the single band preparation pulse is swapped with the other slice, and the contrasts are thus swapped as well.

Another example is to apply two inversion pulses, which target different inversion times. This can be useful, for example, for breast imaging in order to suppress fat and water, or fat and silicone, and can be useful in brain imaging to suppress gray matter in one image and to suppress white matter in another image. This can also be used for T1 mapping.

The method disclosed herein is not limited to use of the TSE sequence, but can be applied to other sequences such as echo planar imaging (EPI). By using an EPI sequence, IR/T2 or IR/T2* contrasts can be simultaneously acquired. In particular, the combination of EPI and IR-EPI (when used in accordance with the invention, can be utilized for T1 mapping, starting from the basic technique disclosed by Wright et al. "Water Proton $T_1$ Measurements in Brain Tissue at 7, 3, and 1.5 T Using IR-EPI, IR-TSE and MPRAG: Results and Optimization," Magn. Reson. Mater. Phy. Vol. 21, pp 121-130 (2008). Another example is to acquire slices simultaneously with EPI FLAIR T2/T2 weightings. This would be a fast option in order to obtain these essential contrasts for uncooperative patients, for example.

The inventive method may also be combined with other simultaneous multislice techniques, such as simultaneous echo refocusing (SER), the basics of which are described by Feinberg et al. "Simultaneous Echo Refocusing in EPI," Magnetic Resonance in Medicine, Vol. 48, pp. 1-5 (2002).

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for acquiring raw magnetic resonance (MR) data from multiple slices of a subject, with a different contrast respectively in two different slices among said multiple slices, said method comprising:

from a computer, operating an MR data acquisition scanner to acquire MR raw data from said multiple slices of a subject by executing a single scanning sequence comprising two iterations;

in a first of said two iterations, operating said MR data acquisition scanner to radiate a single-band inversion pulse that is effective only for a first of said multiple slices, and thereafter operating said MR data acquisition scanner to execute a multi-band excitation and refocusing of said first of said multiple slices and a second of said multiple slices, and acquiring raw MR data in a resulting echo train from both of said first and said second of said multiple slices, with said MR data from said first of said multiple slices having a first weighting due to said single-band inversion pulse, and said MR raw data from said second of said multiple slices having a second weighting due to said single band inversion pulse not being effective for said second of said multiple slices;

in a second of said two iterations, operating said MR data acquisition scanner to radiate another single-band inversion pulse that is effective only for said second of said multiple slices, and thereafter operating said MR data acquisition scanner to execute another mutli-band excitation and refocusing of said first and said second of said multiple slices, and acquiring further raw MR data in another resulting echo train from both of said first and said second of said multiple slices, with said further MR raw data from said second of said multiple slices having said first weighting, due to said another single band inversion pulse, and said further MR raw data from said first of said multiple slices having said second weighting due to said another single band inversion pulse not being effective in said second iteration for said first of said multiple slices;

via said computer, entering said raw MR data, for each of said first and said second of said multiple slices in each of said first and said second iterations, into an electronic memory organized as k-space data, and thereby obtaining a first subset of MR raw data in k-space for said first of said multiple slices with said first weighting, a second subset of MR raw data in k-space for said second of said multiple slices with said second weighting, a third subset of MR raw data in k-space for said first of said multiple slices with said second weighting, and a fourth subset of MR raw data in k-space for said second of said multiple slices with said first weighting; and via said computer, making each of said first, second, third and fourth subsets of MR raw data available in electronic form from said computer, as at least one data file.

2. The method as claimed in claim 1 comprising operating said MR data acquisition scanner to execute said single scanning sequence as a T2/fluid attenuated inversion recovery (FLAIR)-T2 sequence, with said first weighting being a FLAIR-T2 weighting and said second weighting being a pure T2 weighting.

3. The method as claimed in claim 1 comprising operating said MR data acquisition scanner to execute said single scanning sequence as a PD/T1 fluid attenuated inversion recovery (FLAIR) sequence, with said first weighting being a PD weighting and said second weighting being a T1-FLAIR weighting.

4. The method as claimed in claim 1 comprising operating said MR data acquisition scanner to acquire said raw MR data in a plurality of stacks, each of said stacks comprising multiple stack slices, with a first of said stacks comprising said first of said multiple slices and a second of said stacks comprising said second of said multiple slices, and operating said MR data acquisition scanner to produce fat saturation in said multiple stack slices in said first of said stacks and with no fat saturation in the multiple stack slices in said second of said stacks.

5. The method as claimed in claim 4 comprising operating said MR data acquisition scanner to radiate said single band inversion pulse in a STIR short T1 inversion recovery (STIR) sequence within said single scanning sequence to produce said fat suppression in said slices in said first of said stacks.

6. The method as claimed in claim 5 wherein said second weighting is selected from the group consisting of T1, T2 and proton density (PD) weightings.

7. The method as claimed in claim 1 comprising providing said at least one datafile to an image reconstruction computer and, in said image reconstruction computer, reconstructing respective images of said first and said second of said multiple slices, comprising a first image of said first slice produced from said first subset with a first contrast due to said first weighting, a first image of said second of said multiple slices produced from said second subset with a second contrast due to said second weighting, a second image of said first of said multiple slices produced from said third subset with said second contrast due to said second weighting, and a second image of said second of said slices produced from said fourth subset with said first contrast due to said first weighting.

8. The method as claimed in claim 1 comprising selecting said single scanning sequence from the group consisting of echo planar imaging (EPI) sequences and (f) turbo spin echo (TSE) sequences.

9. The method as claimed in claim 1 wherein said multiple slices comprise a third of said multiple slices, and comprising:
operating said MR data acquisition scanner in said first of said two iterations to execute said multi-band excitation and refocusing of said first, said second and said third of said multiple slices and acquiring raw MR data in said resulting echo train in said first of said two iterations from each of said first, said second and said third of said multiple slices, with said MR raw data from said second and said third of said multiple slices having said second weighting due to said single band inversion pulse in said first of said two iterations not being effective for said first and said third of said multiple slices; and
operating said MR data acquisition scanner in said second of said two iterations to radiate said another inversion pulse to be effective only in said second and said third of said multiple slices, and acquiring said raw MR data in said further echo train in said second of said two iterations from said second and said third of said multiple slices with said first weighting due to said another single band inversion pulse.

10. A magnetic resonance (MR) apparatus for acquiring MR raw data from multiple slices of a subject, with a different contrast respectively in two different slices among said multiple slices, said apparatus comprising:
an MR data acquisition scanner;
a computer configured to operate the MR data acquisition scanner to acquire MR raw data from said multiple slices of a subject by executing a single scanning sequence comprising two iterations;
said computer being configured to operate said MR data acquisition scanner in a first of said two iterations, to radiate a single-band inversion pulse that is effective only for a first of said multiple slices, and thereafter to operate said MR data acquisition scanner to execute a multi-band excitation and refocusing of said first of said multiple slices and a second of said multiple slices, and to acquire raw MR data in a resulting echo train from both of said first and second of said multiple slices, with said MR data for said first of said multiple slices having a first weighting due to said single-band inversion pulse, and said MR raw data from said second of said multiple slices having a second weighting due to said single band inversion pulse not being effective for said second of said multiple slices;
said computer being configured to operate said MR data acquisition scanner in a second of said two iterations, to radiate another single-band inversion pulse that is effective only for said second of said multiple slices, and thereafter to operate said MR data acquisition scanner to execute another mutli-band excitation and refocusing of said first and said second of said multiple slices, and to acquire further raw MR data in another resulting echo train from both of said first and said second of said multiple slices, with said further MR raw data from said second of said multiple slices having said first weighting, due to said further single band inversion pulse, and said further MR raw data from said first of said multiple slices having said second weighting due to said another single band inversion pulse not being effective in said second iteration for said first of said multiple slices;
an electronic memory;
said computer being configured to enter said raw MR data, for each of said first and said second of said multiple slices in each of said first and said second iterations, into said electronic memory organized as k-space data, to thereby obtain a first subset of MR raw data in k-space for said first of said multiple slices with said first weighting, a second subset of MR raw data in k-space for said second of said multiple slices with said second weighting, a third subset of MR raw data in k-space for said first of said multiple slices with said second weighting, and a fourth subset of MR raw data in k-space for said second of said multiple slices with said first weighting; and
said computer being configured to make each of said first, second, third and fourth subsets of MR raw data available in electronic form from said computer, as at least one data file.

11. The apparatus method as claimed in claim 10 wherein said computer is configured to operate said MR data acquisition scanner to execute said single scanning sequence as a T2/fluid attenuated inversion recovery (FLAIR)-T2 sequence, with said first weighting being a FLAIR-T2 weighting and said second weighting being a pure T2 weighting.

12. The apparatus method as claimed in claim 10 wherein said computer is configured to operate said MR data acquisition scanner to execute said single scanning sequence as a PD/T1 fluid attenuated inversion recovery (FLAIR) sequence, with said first weighting being a PD weighting and said second weighting being a T1-FLAIR weighting.

13. The apparatus method as claimed in claim 10 wherein said computer is configured to operate said MR data acquisition scanner to acquire said raw MR data in a plurality of stacks, each of said stacks comprising multiple slices, with a first of said stacks comprising said first of said multiple slices and a second of said stacks comprising said second of said multiple slices, and to operate said MR data acquisition scanner to produce fat saturation in said slices in said first of said stacks and with no fat saturation in the slices in said second of said stacks.

14. The apparatus method as claimed in claim 13 wherein said computer is configured to operate said MR data acquisition scanner to radiate said single band inversion pulse in a short T1 inversion recovery (STIR) sequence within said single scanning sequence to produce said fat suppression in said slices in said first of said stacks.

15. The apparatus method as claimed in claim 14 wherein said second weighting is selected from the group consisting of T1, T2 and proton density (PD) weightings.

16. The apparatus method as claimed in claim 10 comprising an image reconstruction computer provided with said at least one datafile, said image reconstruction computer being configured to reconstruct respective images of said first and said second of said multiple slices, comprising a first image of said first slice produced from said first subset with a first contrast due to said first weighting, a first image of said second of said multiple slices produced from said second subset with a second contrast due to said second weighting, a second image of said first of said multiple slices produced from said third subset with said second contrast due to said second weighting, and a second image of said second of said slices produced from said fourth subset with said first contrast due to said first weighting.

17. The apparatus method as claimed in claim 10 wherein said computer is configured to operate said MR data acquisition scanner with said single scanning sequence being selected from the group consisting of echo planar imaging (EPI) sequences and turbo spin echo (TSE) sequences.

18. The apparatus method as claimed in claim 10 wherein said multiple slices comprise a third of said multiple slices, and wherein:

said computer being configured to operate said MR data acquisition scanner in said first of said two iterations to execute said multi-band excitation and refocusing of said first, said second and said third of said multiple slices and to acquire raw MR data in said resulting echo train in said first of said two iterations, from each of said first, said second and said third of said multiple slices, with said MR raw data from said second and said third of said multiple slices having said second weighting due to said single band inversion pulse in said first of said two iterations not being effective for said first and said third of said multiple slices; and said computer being configured to operate said MR data acquisition scanner in said second of said two iterations to radiate said another inversion pulse to be effective only in said second and said third of said multiple slices, and to acquire said raw MR data in said further echo train in said second of said two iterations from said second and said third of said multiple slices with said first weighting due to said another single band inversion pulse.

* * * * *